(12) United States Patent
Wu et al.

(10) Patent No.: US 11,495,489 B2
(45) Date of Patent: *Nov. 8, 2022

(54) METHOD FOR FORMING A SEMICONDUCTOR-ON-INSULATOR (SOI) SUBSTRATE

(71) Applicant: Taiwan Semiconductor Manufacturing Co., Ltd., Hsin-Chu (TW)

(72) Inventors: Cheng-Ta Wu, Shueishang Township (TW); Chia-Shiung Tsai, Hsin-Chu (TW); Jiech-Fun Lu, Madou Township (TW); Kuan-Liang Liu, Pingtung (TW); Shih-Pei Chou, Tainan (TW); Yu-Hung Cheng, Tainan (TW); Yeur-Luen Tu, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 278 days.

This patent is subject to a terminal disclaimer.

(21) Appl. No.: 16/732,696

(22) Filed: Jan. 2, 2020

(65) Prior Publication Data

US 2020/0135541 A1   Apr. 30, 2020

Related U.S. Application Data

(63) Continuation of application No. 16/139,357, filed on Sep. 24, 2018, now Pat. No. 10,553,474.

(Continued)

(51) Int. Cl.
*H01L 21/00* (2006.01)
*H01L 21/762* (2006.01)
(Continued)

(52) U.S. Cl.
CPC .. *H01L 21/76264* (2013.01); *H01L 21/30604* (2013.01); *H01L 21/32137* (2013.01); *H01L 21/32139* (2013.01); *H01L 21/76256* (2013.01)

(58) Field of Classification Search
CPC ............ H01L 21/7624; H01L 21/76256; H01L 21/30604
See application file for complete search history.

(56) References Cited

U.S. PATENT DOCUMENTS 5,013,681 A  *  5/1991  Godbey ............ H01L 21/30604
                                                    438/459
5,937,312 A     8/1999  Iyer et al.
(Continued)

FOREIGN PATENT DOCUMENTS

JP   H1083986 A    3/1998
JP   2007036279 A  2/2007
(Continued)

OTHER PUBLICATIONS

SEH America. "Thin SOI Wafers." Published in 2015.
(Continued)

*Primary Examiner* — Reema Patel
(74) *Attorney, Agent, or Firm* — Eschweiler & Potashnik, LLC

(57) ABSTRACT

Various embodiments of the present application are directed towards a method for forming a semiconductor-on-insulator (SOI) substrate with a thick device layer and a thick insulator layer. In some embodiments, the method includes forming an insulator layer covering a handle substrate, and epitaxially forming a device layer on a sacrificial substrate. The sacrificial substrate is bonded to a handle substrate, such that the device layer and the insulator layer are between the sacrificial and handle substrates, and the sacrificial substrate is removed. The removal includes performing an etch into
(Continued)

the sacrificial substrate until the device layer is reached. Because the device layer is formed by epitaxy and transferred to the handle substrate, the device layer may be formed with a large thickness. Further, because the epitaxy is not affected by the thickness of the insulator layer, the insulator layer may be formed with a large thickness.

20 Claims, 9 Drawing Sheets

Related U.S. Application Data

(60) Provisional application No. 62/724,332, filed on Aug. 29, 2018.

(51) Int. Cl.
 H01L 21/3213 (2006.01)
 H01L 21/306 (2006.01)

(56) References Cited

U.S. PATENT DOCUMENTS

| | | | |
|---|---|---|---|
| 6,291,315 B1* | 9/2001 | Nakayama | H01L 21/3081 257/E21.232 |
| 10,553,474 B1* | 2/2020 | Wu | H01L 21/32137 |
| 2003/0159644 A1 | 8/2003 | Yonehara et al. | |
| 2005/0014347 A1 | 1/2005 | Tomita et al. | |
| 2008/0296724 A1 | 12/2008 | Yamazaki et al. | |
| 2009/0072343 A1 | 3/2009 | Ohnuma et al. | |
| 2009/0098674 A1 | 4/2009 | Yamazaki et al. | |
| 2009/0111248 A1 | 4/2009 | Ohnuma et al. | |
| 2009/0117703 A1 | 5/2009 | Yamazaki | |
| 2009/0170287 A1 | 7/2009 | Endo et al. | |
| 2010/0087046 A1 | 4/2010 | Ohnuma | |
| 2010/0176495 A1 | 7/2010 | Chu et al. | |
| 2011/0230003 A1* | 9/2011 | Vaufredaz | H01L 21/76256 438/67 |
| 2012/0329242 A1 | 12/2012 | Hanaoka et al. | |
| 2015/0357207 A1* | 12/2015 | Peethala | H01L 21/30604 156/345.21 |
| 2016/0372416 A1* | 12/2016 | Gambino | H01L 21/76251 |
| 2017/0338143 A1 | 11/2017 | Peidous et al. | |
| 2019/0181035 A1 | 6/2019 | Schwarzenbach et al. | |

FOREIGN PATENT DOCUMENTS

| | | |
|---|---|---|
| JP | 2011093798 A | 5/2011 |
| KR | 20110010326 A | 2/2011 |
| WO | 2007107176 A1 | 9/2007 |

OTHER PUBLICATIONS

Smart Cut Technology. "Smart Choice—Soitec." Published in 2016.
Notice of Allowance dated Dec. 2, 2019 for U.S. Appl. No. 16/139,357.

* cited by examiner

METHOD FOR FORMING A SEMICONDUCTOR-ON-INSULATOR (SOI) SUBSTRATE

REFERENCE TO RELATED APPLICATION

This Application is a Continuation of U.S. application Ser. No. 16/139,357, filed on Sep. 24, 2018, which claims the benefit of U.S. Provisional Application No. 62/724,332, filed on Aug. 29, 2018. The contents of the above-referenced Patent Applications are hereby incorporated by reference in their entirety.

BACKGROUND

Integrated circuits have traditionally been formed on bulk semiconductor substrates. In recent years, semiconductor-on-insulator (SOI) substrates have emerged as an alternative to bulk semiconductor substrates. An SOI substrate comprises a handle substrate, an insulator layer overlying the handle substrate, and a device layer overlying the insulator layer. Among other things, an SOI substrate leads to reduced parasitic capacitance, reduced leakage current, reduced latch up, and improved semiconductor device performance (e.g., lower power consumption and higher switching speed).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
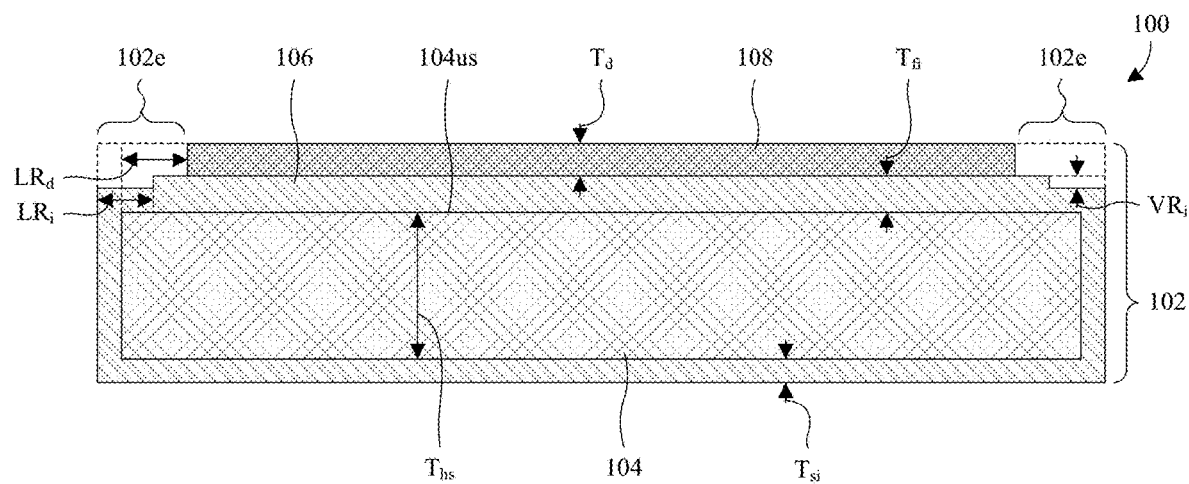
FIG. 1 illustrates a cross-sectional view of some embodiments of a semiconductor-on-insulator (SOI) substrate with a thick device layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to a method for forming a semiconductor-on-insulator (SOI) substrate, a device substrate is oxidized to form an oxide layer surrounding the device substrate. Hydrogen ions are implanted into the device substrate to form a hydrogen-rich region buried in the device substrate. The device substrate is bonded to a handle substrate through the oxide layer, and the device substrate is split along the hydrogen-rich region to partially remove a portion of the oxide layer and a portion of the device substrate from the handle substrate. A chemical mechanical polish (CMP) is performed into a portion of the device substrate remaining on the handle substrate to flatten the remaining portion. The remaining portion of the device substrate defines a device layer of the SOI substrate, and a portion of the oxide layer remaining on the handle substrate defines an insulator layer of the SOI substrate.

A challenge with the method is that the method is limited to forming the device layer and the insulator layer with small thicknesses. For example, the device layer and the insulator layer may respectively be limited to a device layer thickness less than about 2700 angstroms and an insulator layer thickness less than about 6800 angstroms. The small thicknesses may, for example, arise due to the use of ion implantation to form the hydrogen-rich region. The device layer thickness is defined by the depth to which ions are implanted. Therefore, since ion implantation is limited to a small depth, the device layer is limited to a small thickness. Further, the ions are implanted through the insulator layer, which dissipates some of the implant energy. Due to this dissipation, the depth to which ions may be implanted decreases as the thickness of the insulator layer increases and limits the insulator layer to a small thickness.

The small thicknesses limit use of the SOI substrate. For example, the small thickness of the device layer may limit devices on the device layer to small semiconductor junctions (e.g., small PN junctions), whereby use of the SOI substrate may be limited for applications depending upon large semiconductor junctions. As another example, the small thickness of the insulator layer may limit electrical isolation between devices on the device layer, whereby use of the SOI substrate may be limited for applications depending upon low leakage current. Applications where the small thicknesses pose challenges include, for example, high voltage (e.g., greater than about 100 volts) applications, bipolar complementary metal-oxide-semiconductor (CMOS) double-diffused metal-oxide-semiconductor (DMOS) (BCD) applications, embedded flash (eFlash) applications, CMOS image sensor (CIS) applications, near infrared (NIR) applications, and other applications. A solution to the small thicknesses is to perform epitaxial regrowth to increase a thickness of the device layer. However, this increases costs and reduces manufacturing throughput.

Various embodiments of the present application are directed towards a method for forming a SOI substrate with a thick device layer and a thick insulator layer. In some embodiments, the method includes forming an insulator layer fully covering a handle substrate, and epitaxially forming a device layer on a sacrificial substrate. The sacrificial substrate is bonded to a handle substrate, such that the device layer and the insulator layer are between the sacrificial and handle substrates, and the sacrificial substrate is removed. The removal includes performing an etch into the sacrificial substrate until the device layer is reached. In some embodiments, the method further includes etching edge portions of the device layer and stopping on the insulator layer, such that the handle substrate is fully covered throughout the etching.

Because the device layer is formed by epitaxy and transferred to the handle substrate, the device layer may be formed with a large thickness (e.g., a thickness greater than about 0.3 micrometers). Epitaxy is not subject to the thickness restrictions associated with other approaches for forming the device layer (e.g., approaches forming the device layer using ion implantation). Further, because the epitaxy is not affected by the thickness of the insulator layer, the insulator layer may be formed with a large thickness (e.g., a thickness greater than about 1 micrometer). Because the sacrificial substrate is removed using the etch, the removal may be highly controlled and total thickness variation (TTV) of the device layer may be low. The TTV may, for example, be the difference between a smallest thickness value across the device layer and a largest thickness value across the device layer. Because the handle substrate remains fully covered throughout the etching of the edge portions, arcing at the handle substrate may be avoided in embodiments in which the handle substrate has a high resistance and the etching is performed by dry etching. Further, arcing at the handle substrate may be avoided for subsequent plasma processing (e.g., plasma etching) used to form semiconductor devices on the SOI substrate.

With reference to FIG. 1, a cross-sectional view 100 of some embodiments of a SOI substrate 102 is provided. The SOI substrate 102 may, for example, be used with high voltage devices, BCD devices, eFlash devices, CMOS image sensors, NIR image sensors, and other devices. The high voltage devices may, for example, be devices operating at voltages greater than about 100 volts. In some embodiments, the SOI substrate 102 has a circular top layout and/or has a diameter of about 200, 300, or 450 millimeters. In other embodiments, the SOI substrate 102 has some other shape and/or some other dimensions. Further, in some embodiments, the SOI substrate 102 is a semiconductor wafer. The SOI substrate 102 comprises a handle substrate 104, an insulator layer 106, and a device layer 108. The handle substrate 104 may be or comprise, for example, monocrystalline silicon, some other silicon material, some other semiconductor material, or any combination of the foregoing.

In some embodiments, the handle substrate 104 has a high resistance and/or a low oxygen concentration. The high resistance may, for example, be greater than about 1, 3, 4, or 9 kilo-ohms/centimeter (kΩ/cm), and/or may, for example, be about 1-4 kΩ/cm, about 4-9 kΩ/cm, or about 1-9 kΩ/cm. The low oxygen concentration may, for example, be less than about 1, 2, or 5 parts per million atoms (ppma), and/or may, for example, be between about 0.1-2.5 ppma, about 2.5-5.0 ppma, or about 0.1-5.0 ppma. The low oxygen concentration and the high resistance individually reduce substrate and/or radio frequency (RF) losses. In some embodiments, the handle substrate 104 has a low resistance. The low resistance reduces costs of the handle substrate 104 but may lead to increased substrate and/or RF losses. The low resistance may, for example, be less than about 8, 10, or 12 Ω/cm, and/or may, for example, be between about 8-12 Ω/cm, about 8-10 Ω/cm, or about 10-12 Ω/cm. In some embodiments, the handle substrate 104 is doped with p-type or n-type dopants. The resistance of the handle substrate 104 may, for example, be controlled by a doping concentration of the handle substrate 104. For example, increasing the doping concentration may decrease resistance, whereas decreasing the doping concentration may increase resistance, or vice versa. In some embodiments, a thickness $T_{hs}$ of the handle substrate 104 is about 720-780 micrometers, about 720-750 micrometers, or about 750-780 micrometers.

The insulator layer 106 overlies the handle substrate 104 and may be or comprise, for example, silicon oxide, silicon-rich oxide (SRO), some other oxide, some other dielectric, or any combination of the foregoing. In some embodiments, the insulator layer 106 completely covers an upper surface 104us of the handle substrate 104. In at least some embodiments in which the handle substrate 104 has the high resistance, completely covering the upper surface 104us of the handle substrate 104 prevents arcing during plasma processing (e.g., plasma etching) used to form devices (not shown) on the device layer 108. In some embodiments, the insulator layer 106 completely encloses the handle substrate 104. The insulator layer 106 has a first insulator thickness $T_{fi}$ at a top of the handle substrate 104, between the device layer 108 and the handle substrate 104. The first insulator thickness $T_{fi}$ is large so as to provide a high degree of electrical insulation between the handle substrate 104 and the device layer 108. The high degree of electrical insulation may, for example, enable reduced leakage current between devices (not shown) on the device layer 108 and/or may, for example, enhance performance of the devices. In some embodiments, the first insulator thickness $T_{fi}$ is about 0.2-2.5 micrometers, about 0.2-1.35 micrometers, or about 1.35-2.5 micrometers, and/or is greater than about 1 or 2 micrometers. In some embodiments, the insulator layer 106 has a second insulator thickness $T_{si}$ at a bottom of the handle substrate 104 and/or along sidewalls of the handle substrate 104. In some embodiments, the second insulator thickness $T_{si}$ is less than the first insulator thickness $T_{fi}$. In some embodiments, the second insulator thickness $T_{si}$ is about 20-6000 angstroms, about 20-3010 angstroms, or about 3010-6000 angstroms.

In some embodiments, the insulator layer 106 has stepped profiles at SOI edge portions 102e of the SOI substrate 102 that are respectively on opposite sides of the SOI substrate 102. In some embodiments, the insulator layer 106 has upper surfaces that are at the SOI edge portions 102e and that are recessed below a top surface of the insulator layer 106 by a vertical recess amount $VR_i$. The vertical recess amount $VR_i$ may, for example, be about 20-6000 angstroms, about 20-3010 angstroms, or about 3010-6000 angstroms. In some embodiments, the sum of the vertical recess amount $VR_i$ and the second insulator thickness $T_{si}$ is equal or about equal to the first insulator thickness $T_{fi}$. In some embodiments, the insulator layer 106 has inner sidewalls that are at the SOI edge portion 102e and that are laterally recessed respectively from outer sidewalls of the insulator layer 106 by an insulator lateral recess amount $LR_i$. The insulator lateral recess amount $LR_i$ may, for example, be about 0.8-1.2 millimeters, about 0.8-1.0 millimeters, or about 1.0-1.2 millimeters.

The device layer 108 overlies the insulator layer 106 and may, for example, be or comprise monocrystalline silicon, some other silicon, some other semiconductor material, or any combination of the foregoing. In some embodiments, the device layer 108 and the handle substrate 104 are the same semiconductor material (e.g., monocrystalline silicon). The device layer 108 has a thickness $T_d$ that is large. The large thickness of the device layer 108 may, for example, enable formation of large semiconductor junctions (e.g., PN junctions) upon which certain devices (e.g., NIR image sensors) may depend. In some embodiments, the thickness $T_d$ of the device layer 108 is large in that it is greater than about 0.2, 0.3, 1.0, 5.0, or 8.0 micrometers, and/or in that it is about 0.2-8.0 micrometers, about 0.2-4.0 micrometers, or about 4.0-8.0 micrometers. In some embodiments, the device layer 108 has sidewalls that are at the SOI edge portion 102e and that are laterally recessed respectively from sidewalls of the handle substrate 104 by a device lateral recess amount $LR_d$. The device lateral recess amount $LR_d$ may, for example, be about 1.4-2.5 millimeters, about 1.4-1.9 millimeters, or about 1.9-2.5 millimeters. Further, the device lateral recess amount $LR_d$ may, for example, be larger than the insulator lateral recess amount $LR_i$.

Figure 2:
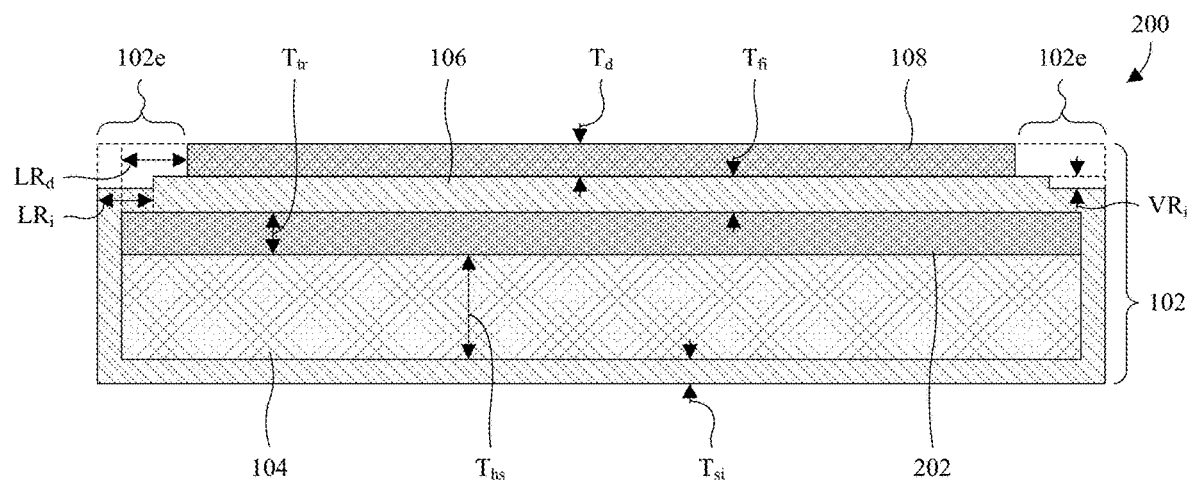
FIG. 2 illustrates a cross-sectional view of some alternative embodiments of the SOI substrate of FIG. 1 in which a trap-rich layer separates a handle substrate of the SOI substrate and an insulator layer of the SOI substrate.

With reference to FIG. 2, a cross-sectional view 200 of some alternative embodiments of the SOI substrate 102 of FIG. 1 is provided in which a trap-rich layer 202 separates the handle substrate 104 from the insulator layer 106. The trap-rich layer 202 has a high density of carrier traps relative to the handle substrate 104 and/or relative to the device layer 108. The carrier traps may be or comprise, for example, dislocations and/or other defects in a crystalline lattice of the trap-rich layer 202. The carrier traps trap mobile carriers (e.g., mobile electrons) along a top surface of the handle substrate 104 to reduce the effects of parasitic surface conduction (PSC). The mobile carriers may, for example, be drawn to the top surface of the handle substrate 104 by fixed charge in the insulator layer 106. By reducing the effects of PSC, the trap-rich layer 202 promotes low substrate and/or RF losses, passive device with high Q factors, low crosstalk, and high linearity (e.g., low second harmonics).

In some embodiments, the trap-rich layer 202 is or comprises undoped polycrystalline silicon, amorphous silicon, or some other suitable semiconductor material that has a high density of carrier traps. In some embodiments in which the trap-rich layer 202 is or comprises undoped polycrystalline silicon, the carrier traps concentrate at grain boundaries of the undoped polycrystalline silicon and reducing grain sizes of the undoped polycrystalline silicon increases the density of carrier traps in the undoped polycrystalline silicon. In some embodiments, a thickness $T_{tr}$ of the trap-rich layer 202 is between about 1-2 micrometers, about 1.0-1.5 micrometers, or about 1.5-2.0 micrometers. If the thickness $T_{tr}$ is too small (e.g., less than about 1.0 micrometer), the trap-rich layer 202 may be ineffective at trapping mobile carrier and reducing the effect of PSC. If the thickness $T_{tr}$ is too large (e.g., greater than about 2.0 micrometers), the SOI substrate 102 may be prone to a high amount of substrate warpage. In some embodiments, the handle substrate 104 has a high resistance and/or a low oxygen concentration. The high resistance may, for example, be greater than about 1, 3, 4, or 9 kΩ/cm, and/or may, for example, be between about 1-4 kΩ/cm, about 4-9 kΩ/cm, or about 1-9 kΩ/cm. The low oxygen concentration may, for example, be less than about 1, 2, 5, or 10 ppma, and/or may, for example, be between about 1-2 ppma, 2-5 ppma, or 5-10 ppma.

Figure 3:
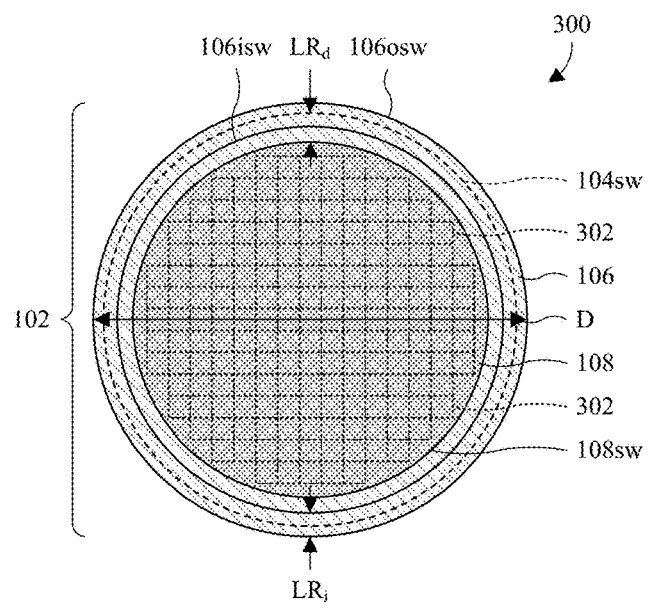
FIG. 3 illustrates a top view of some embodiments of the SOI substrate of FIG. 1.

With reference to FIG. 3, a top view 300 of some embodiments of the SOI substrate 102 of FIG. 1 is provided. The SOI substrate 102 is circular and comprises a plurality of IC dies 302 arranged in a grid across the device layer 108. For ease of illustration, only some of the IC dies 302 are labeled 302. In some embodiments, a diameter D of the SOI substrate 102 is about 150, 200, 300, or 450 millimeters. In some embodiments, an inner sidewall 106isw of the insulator layer 106 is laterally recessed from an outer sidewall 106osw of the insulator layer 106 by an insulator lateral recess amount $LR_i$. In some embodiments, a sidewall 108sw of the device layer 108 is laterally recessed from a sidewall 104sw (shown in phantom) of the handle substrate 104 by a device lateral recess amount $LR_d$. The insulator lateral recess amount $LR_i$ may, for example, be about 0.8-1.2 millimeters, about 0.8-1.0 millimeters, or about 1.0-1.2 millimeters. The device lateral recess amount $LR_d$ may, for example, be greater than the insulator lateral recess amount $LR_i$ and/or may, for example, be about 1.4-2.5 millimeters, about 1.4-1.9 millimeters, or about 1.9-2.5 millimeters.

Figure 4:
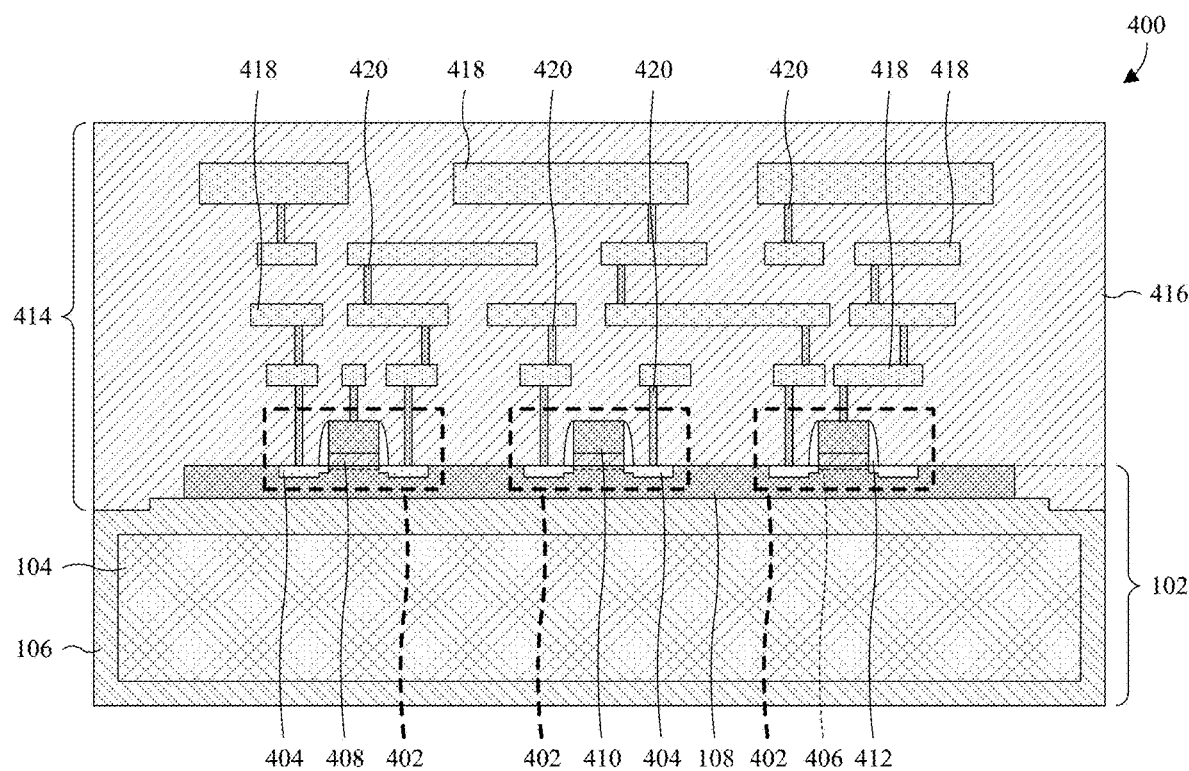
FIG. 4 illustrates a cross-sectional view of some embodiments of a semiconductor structure in which the SOI substrate of FIG. 1 finds application.

With reference to FIG. 4, a cross-sectional view 400 of some embodiments of a semiconductor structure in which the SOI substrate 102 of FIG. 1 finds application is provided. The semiconductor structure comprises a plurality of semiconductor devices 402 laterally spaced over the device layer 108. The semiconductor devices 402 may be, for example, metal-oxide-semiconductor field-effect transistor (MOSFETs), some other metal-oxide-semiconductor (MOS) devices, some other insulated-gate field-effect transistors (IGFETs), some other semiconductor devices, or any combination of the foregoing. Further, the semiconductor devices 402 may be, for example, high voltage devices, BCD devices, eFlash devices, CMOS image sensors, NIR image sensors, some other devices, or any combination of the foregoing.

In some embodiments, the semiconductor devices 402 comprise corresponding source/drain regions 404, corresponding selectively-conductive channels 406, corresponding gate dielectric layers 408, corresponding gate electrodes 410, and corresponding spacers 412. For ease of illustration, only some of the source/drain regions 404 are labeled 404, only one of the selectively-conductive channels 406 is labeled 406, only one of the gate dielectric layers 408 is labeled 408, only one of the gate electrodes 410 is labeled 410, and only one of the spacers 412 is labeled 412. The source/drain regions 404 and the selectively-conductive channels 406 are in the device layer 108. The source/drain regions 404 are respectively at ends of the selectively-conductive channels 406, and each of the selectively-conductive channels 406 extends from one of the source/drain regions 404 to another one of the source/drain regions 404. The source/drain regions 404 have a first doping type and directly adjoin portions of the device layer 108 having a second doping type opposite the first doping type.

The gate dielectric layers 408 respectively overlie the selectively-conductive channels 406, and the gate electrodes 410 respectively overlie the gate dielectric layers 408. The gate dielectric layers 408 may be or comprise, for example, silicon oxide and/or some other dielectric material, and/or the gate electrodes 410 may be or comprise, for example, doped polysilicon, metal, some other conductive material, or any combination of the foregoing. The spacers 412 overlie the source/drain regions 404 and respectively line sidewalls of the gate electrodes 410 and sidewalls of the gate dielectric layers 408. The spacers 412 may be or comprise, for example, silicon oxide, silicon nitride, silicon oxynitride, silicon carbide, some other dielectric, or any combination of the foregoing.

A back-end-of-line (BEOL) interconnect structure 414 covers the SOI substrate 102 and the semiconductor devices 402. The BEOL interconnect structure 414 comprises an interconnect dielectric layer 416, a plurality of wires 418, and a plurality of vias 420. For ease of illustration, only some of the wires 418 are labeled 418, and only some of the vias 420 are labeled 420. The interconnect dielectric layer 416 may be or comprise, for example, borophosphosilicate glass (BPSG), phosphor-silicate glass (PSG), undoped silicon glass (USG), some other low κ dielectric, silicon oxide, some other dielectric, or any combination of the foregoing. As used herein, a low κ dielectric may be or comprise, for example, a dielectric with a dielectric constant κ less than about 3.9, 3, 2, or 1.

The wires 418 and the vias 420 are alternatingly stacked in the interconnect dielectric layer 416 and define conductive paths extending to the semiconductor devices 402. The conductive paths may, for example, electrically couple the semiconductor devices 402 to other devices (e.g., other semiconductor devices), contact pads, or some other structures. The wires 418 and the vias 420 may be or comprise, for example, copper, aluminum copper, aluminum, tungsten, some other metal, or any combination of the foregoing. In some embodiments, topmost wires of the wires 418 are thicker than underlying wires of the wires 418.

While FIGS. 3 and 4 are described with regard to embodiments of the SOI substrate 102 in FIG. 1, it is to be understood that embodiments of the SOI substrate 102 in FIG. 2 may alternatively be used in FIGS. 3 and 4. While FIG. 3 illustrates a specific number of IC dies 302 and a specific layout of IC dies 302, more or less IC dies 302 and/or other layouts of dies 302 is/are amenable in other embodiments. While FIG. 4 illustrates a specific layout of the BEOL interconnect structure 414, other layouts of the BEOL interconnect structure 414 are amenable in other embodiments. While FIG. 4 illustrates three semiconductor devices 402 and a specific layout for the semiconductor devices 402, more or less semiconductor devices and/or other layouts for the semiconductor devices 402 is/are amenable.

With reference to FIGS. 5-16, a series of cross-sectional views 500-1600 of some embodiments of a method for forming and using an SOI substrate 102 is provided. While the method is illustrated as forming embodiments of the SOI substrate 102 in FIG. 1, the method may alternatively form embodiments of the SOI substrate 102 in FIG. 2 and other embodiments of the SOI substrate 102. Further, while the cross-sectional views 500-1600 shown in FIGS. 5-16 are described with reference to a method, it will be appreciated that the structures shown in FIGS. 5-16 are not limited to the method and may stand alone without the method.

Figure 5:
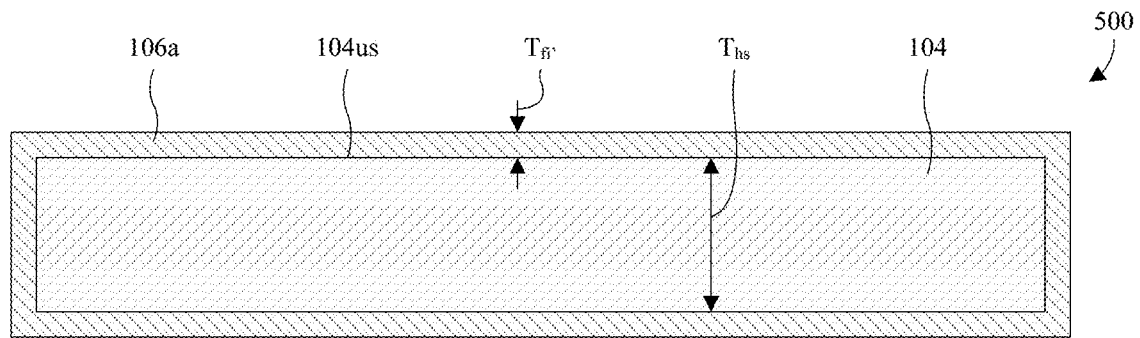
FIGS. 5-16 illustrate a series of cross-sectional views of some embodiments of a method for forming and using an SOI substrate with a thick device layer.

As illustrated by the cross-sectional view 500 of FIG. 5, a handle substrate 104 is provided. In some embodiments, the handle substrate 104 is or comprises monocrystalline silicon, some other silicon material, some other semiconductor material, or any combination of the foregoing. In some embodiments, the handle substrate 104 has a circular top layout and/or has a diameter of about 200, 300, or 450 millimeters. In other embodiments, the handle substrate 104 has some other shape and/or some other dimensions. Further, in some embodiments, the handle substrate 104 is a semiconductor wafer. In some embodiments, the handle substrate 104 has a high resistance and/or a low oxygen concentration. The high resistance and the low oxygen concentration individually reduce substrate and/or RF losses. The high resistance may, for example, be greater than about 1, 3, 4, or 9 kΩ/cm, and/or may, for example, be between about 1-4 kΩ/cm, about 4-9 kΩ/cm, or about 1-9 kΩ/cm. The low oxygen concentration may, for example, be less than about 1, 2, or 5 ppma, and/or may, for example, be between about 0.1-2.5 ppma, about 2.5-5.0 ppma, or about 0.1-5.0 ppma. In some embodiments, the handle substrate 104 has a low resistance to reduce substrate costs since a high resistance substrate may, for example, be costlier than a low resistance substrate. The low resistance may, for example, be less than about 8, 10, or 12 Ω/cm, and/or may, for example, be about 8-12 Ω/cm, about 8-10 Ω/cm, or about 10-12 Ω/cm. In some embodiments, the handle substrate 104 is doped with p-type or n-type dopants. The resistance of the handle substrate 104 may, for example, be controlled by a doping concentration of the handle substrate 104. In some embodiments, a thickness $T_{hs}$ of the handle substrate 104 is about 720-780 micrometers, about 720-750 micrometers, or about 750-780 micrometers.

Also illustrated by the cross-sectional view 500 of FIG. 5, a first insulator layer 106a is formed on an upper surface 104us of the handle substrate 104. In some embodiments, the first insulator layer 106a completely covers the upper surface 104us of the handle substrate 104. In at least some embodiments where the handle substrate 104 has the high resistance, completely covering the upper surface 104us may, for example, prevent arcing during plasma processing performed hereafter. In some embodiments, the first insulator layer 106a completely encloses the handle substrate 104. In some embodiments, the first insulator layer 106a is or comprises silicon oxide and/or some other dielectric. In some embodiments, a thickness $T_{fi}$ of the first insulator layer 106a is about 0.2-2.0 micrometers, about 0.2-1.1 micrometers, or about 1.1-2.0 micrometers.

In some embodiments, a process for forming the first insulator layer 106a comprises depositing the first insulator layer 106a by thermal oxidation, chemical vapor deposition (CVD), physical vapor deposition (PVD), some other deposition process, or any combination of the foregoing. For example, the first insulator layer 106a may be deposited by a dry oxidation process using oxygen gas (e.g., $O_2$) or some other gas as an oxidant. As another example, the first insulator layer 106a may be deposited by a wet oxidation process using water vapor as an oxidant. In some embodiments, the first insulator layer 106a is formed at temperatures of about 800-1100 degrees Celsius (° C.), about 800-950° C., or about 950-1100° C. For example, where the first insulator layer 106a is formed by thermal oxidation (e.g., any one of the wet and dry oxidation processes), the first insulator layer 106a may be formed at these temperatures.

Figure 6:
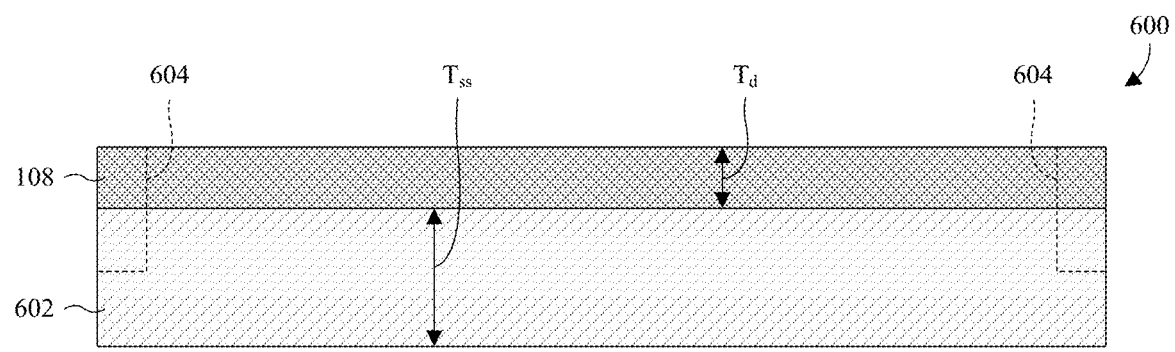

As illustrated by the cross-sectional view 600 of FIG. 6, a sacrificial substrate 602 is provided. In some embodiments, the sacrificial substrate 602 is or comprises monocrystalline silicon, some other silicon material, some other semiconductor material, or any combination of the foregoing. In some embodiments, the sacrificial substrate 602 is doped with p-type or n-type dopants and/or has a low resistivity. The low resistance may, for example, be less than about 0.01 or 0.02 Ω/cm and/or may, for example, be about 0.01-0.2 Ω/cm. In some embodiments, the sacrificial substrate 602 has a lower resistance than the handle substrate 104 (see FIG. 5). In some embodiments, the sacrificial substrate 602 has a circular top layout and/or has a diameter of about 200, 300, or 450 millimeters. In other embodiments, the sacrificial substrate 602 has some other shape and/or some other dimensions. In some embodiments, the sacrificial substrate 602 is a bulk semiconductor substrate and/or is a semiconductor wafer. In some embodiments, a thickness $T_{ss}$ of the sacrificial substrate 602 is about 720-780 micrometers, about 720-750 micrometers, or about 750-780 micrometers. In some embodiments, the thickness $T_{ss}$ of the sacrificial substrate 602 is the same or about the same as the thickness $T_{hs}$ of the handle substrate 104 (see FIG. 5).

Also illustrated by the cross-sectional view 600 of FIG. 6, a device layer 108 is formed on the sacrificial substrate 602. The device layer 108 has a thickness $T_d$ that is large. In some embodiments, the thickness $T_d$ is large in that it is about 0.7-10.0 micrometers, about 0.7-5.0 micrometers, or about 5.0-10.0 micrometers, and/or in that it is greater than about 0.7, 5.0, or 10.0 micrometers. In some embodiments, the device layer 108 is or comprises monocrystalline silicon, some other silicon material, some other semiconductor material, or any combination of the foregoing. In some embodiments, the device layer 108 is or comprises the same semiconductor material as the sacrificial substrate 602, has the same doping type as the sacrificial substrate 602, has a lower doping concentration than the sacrificial substrate 602, or any combination of the foregoing. For example, the sacrificial substrate 602 may be or comprise P+ monocrystalline silicon, whereas the device layer 108 may be or comprise P− monocrystalline silicon. In some embodiments, the device layer 108 has a low resistance. The low resistance may, for example, be greater than that of the sacrificial substrate 602. Further, the low resistance may, for example, be less than about 8, 10, or 12 Ω/cm, and/or may, for example, be about 8-12 Ω/cm, about 8-10 Ω/cm, or about 10-12 Ω/cm. In some embodiments, the device layer 108 has the same doping type, the same doping concentration, the same resistivity, or any combination of the foregoing as the handle substrate 104 (see FIG. 5). In some embodiments, a process for forming the device layer 108 comprises molecular beam epitaxy (MBE), vapor phase epitaxy (VPE), liquid phase epitaxy (LPE), some other epitaxial process, or any combination of the foregoing.

Figure 7:
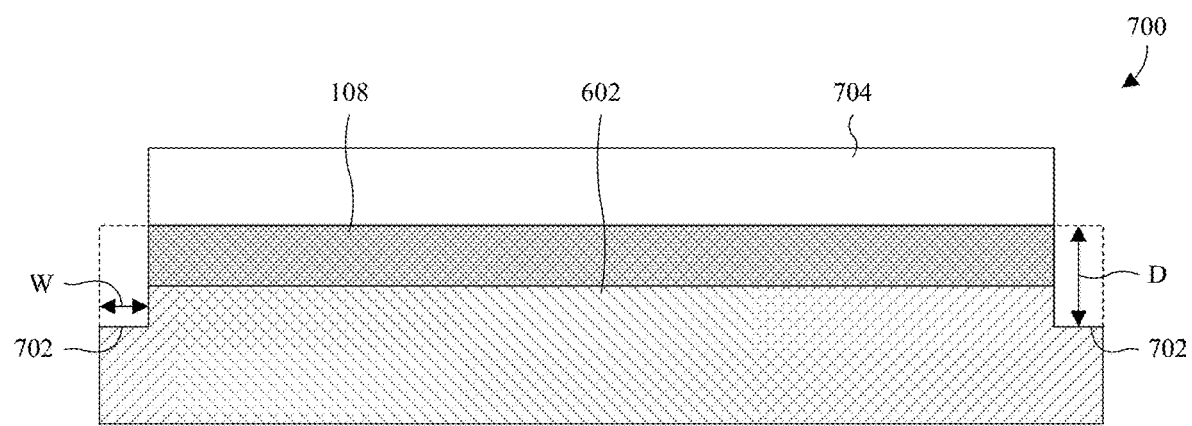

As illustrated by the cross-sectional view 700 of FIG. 7, the device layer 108 and the sacrificial substrate 602 are patterned. The patterning removes edge regions 604 (see FIG. 6) defined by the device layer 108 and the sacrificial substrate 602. By removing the edge regions 604, defects are prevented from forming at the edge regions 604 during subsequent grinding and/or chemical wet etching. The edge defects have a propensity to concentrate at the edge regions 604 and negatively impact the quality of the device layer 108. Further, the patterning forms a ledge 702 at an edge of the sacrificial substrate 602. The ledge 702 is defined by the sacrificial substrate 602 and has a pair of ledge segments respectively on opposite sides of the sacrificial substrate 602. In some embodiments, the ledge 702 has a top layout that extends along an edge of the sacrificial substrate 602 in a ring-shaped path or some other closed path. In some embodiments, the ledge 702 has a width W of about 0.8-1.2 millimeters, about 0.8-1.0 millimeters, or about 1.0-1.2 millimeters. In some embodiments, the ledge 702 is recessed below an upper or top surface of the device layer 108 by a distance D of about 30-120 micrometers, about 30-75 micrometers, or about 75-120 micrometers. In some embodiments, the ledge 702 is further recessed below an upper or top surface of the sacrificial substrate 602.

In some embodiments, the patterning is performed by a photolithography/etching process or some other patterning process. Further, in some embodiments, the patterning comprises forming a mask 704 over the device layer 108, performing an etch into the device layer 108 and the sacrificial substrate 602 with the mask 704 in place, and removing the mask 704. The mask 704 may, for example, be formed so the device layer 108 and the sacrificial substrate 602 are completely covered except for at the edge regions 604. In some embodiments, the mask 704 is or comprise silicon nitride, silicon oxide, some other hard mask material, photoresist, some other mask material, or any combination of the foregoing. In some embodiments, the mask 704 is formed using a wafer edge exposure (WEE) process tool. For example, a process for forming the mask 704 may comprise: depositing a photoresist layer on the device layer 108; selectively exposing an edge portion of the photoresist layer to radiation using the WEE process tool; and developing the photoresist layer to form the mask 704.

Figure 8:
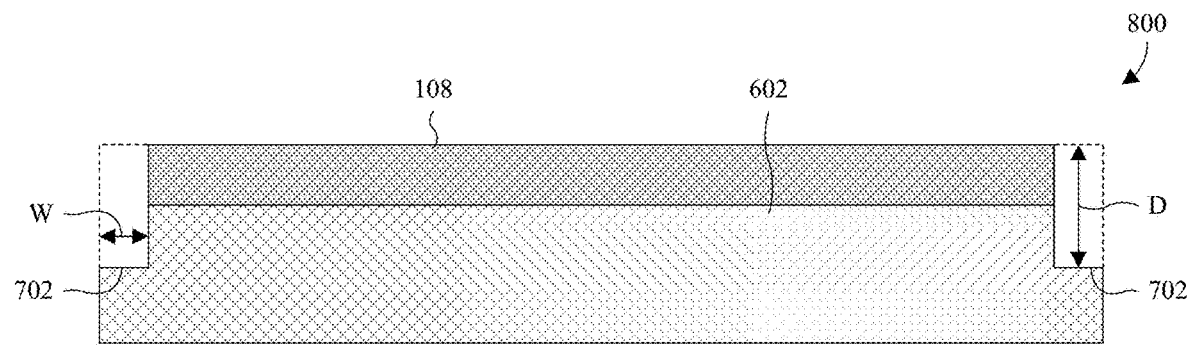

As illustrated by the cross-sectional view 800 of FIG. 8, the device layer 108 and the sacrificial substrate 602 are cleaned to remove etch residue and/or other undesired byproducts produced while performing preceding processes (e.g., the patterning of FIG. 7). In some embodiments, the cleaning process scrubs the device layer 108 and the sacrificial substrate 602 using a physical brush or a water jet. In some embodiments, the cleaning process cleans the device layer 108 and the sacrificial substrate 602 using a chemical solution. The chemical solution may, for example, be or comprise hydrofluoric acid or some other chemical solution. In some embodiments, the cleaning increases the distance D at which the ledge 702 is recessed below the upper or top surface of the device layer 108. In other embodiments, the distance D remains substantially unchanged from the patterning at FIG. 7.

Figure 9:
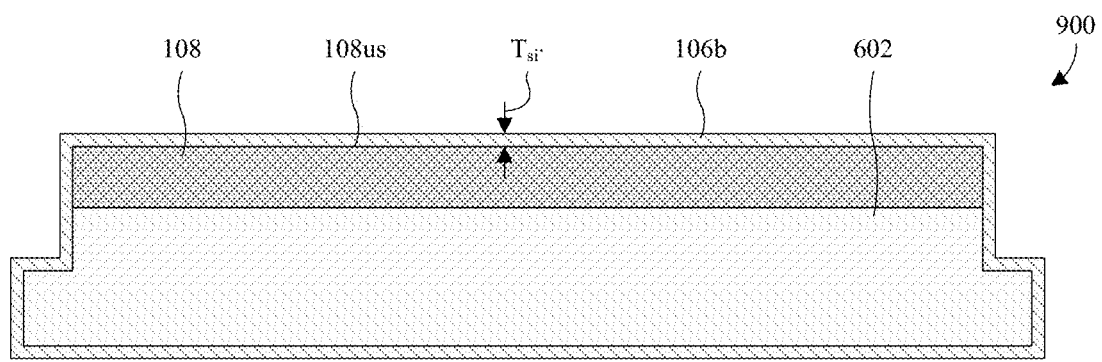

As illustrated by the cross-sectional view 900 of FIG. 9, a second insulator layer 106b is formed on an upper surface 108us of the device layer 108. In some embodiments, the second insulator layer 106b completely covers the upper surface 108us of the device layer 108. In some embodiments, the second insulator layer 106b completely encloses the sacrificial substrate 602 and the device layer 108. In some embodiments, the second insulator layer 106b is or comprises silicon oxide and/or some other dielectric. In some embodiments, the second insulator layer 106b is the same dielectric material as the first insulator layer 106a. In some embodiments, a thickness $T_{si'}$ of the second insulator layer 106b is about 20-6000 angstroms, about 20-3010 angstroms, or about 3010-6000 angstroms.

In some embodiments, a process for forming the second insulator layer 106b comprises depositing the second insulator layer 106b by thermal oxidation, CVD, PVD, some other deposition process, or any combination of the foregoing. For example, the second insulator layer 106b may be deposited by a dry oxidation process using oxygen gas (e.g., $O_2$) or some other gas as an oxidant. As another example, the second insulator layer 106b may be deposited by a wet oxidation process using water vapor as an oxidant. In some embodiments, the second insulator layer 106b is formed at temperatures of about 750-1100° C., about 750-925° C., or about 925-1100° C. For example, where the second insulator layer 106b is formed by thermal oxidation (e.g., any one of the wet and dry oxidation processes), the second insulator layer 106b may be formed at these temperatures. In some embodiments, the second insulator layer 106b is formed at a temperature less than that of the first insulator layer 106a.

Figure 10:
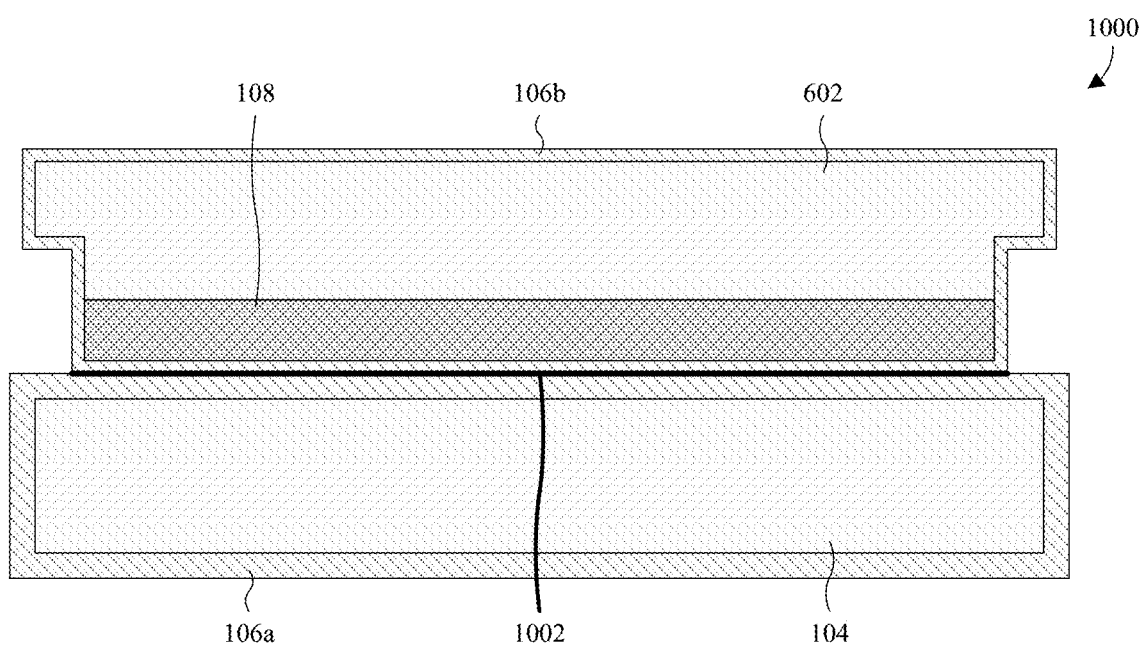

As illustrated by the cross-sectional view 1000 of FIG. 10, the sacrificial substrate 602 is bonded to the handle substrate 104, such that the device layer 108, the first insulator layer 106a, and the second insulator layer 106b are between the handle substrate 104 and the sacrificial substrate 602. The bonding presses the first and second insulator layers 106a, 106b together and forms a bond 1002 at an interface at which the first insulator layer 106a and the second insulator layer 106b directly contact. The bonding may, for example, be performed by fusion bonding, vacuum bonding, or some other bonding process. The fusion bonding may, for example, be performed with a pressure at about 1 standard atmosphere (atm), about 0.5-1.0 atm, about 1.0-1.5, or about 0.5-1.5 atm. The vacuum bonding may, for example, be performed with a pressure at about 0.5-100 millibars (mBar), about 0.5-50 mBar, or about 50-100 mBar.

In some embodiments, a bond anneal is performed to strengthen the bond 1002. In some embodiments, the bond anneal is performed at a temperature of about 300-1150° C., about 300-725° C., or about 735-1150° C. In some embodiments, the bond anneal is performed for about 2-5 hours, about 2-3.5 hours, or about 3.5-5 hours. In some embodiments, the bond anneal is performed with a pressure at about 1 atm, about 0.5-1.0 atm, about 1.0-1.5, or about 0.5-1.5 atm. In some embodiments, the bond anneal is performed while nitrogen gas (e.g., $N_2$) and/or some other gas flows over the structure of FIG. 10. The flow rate for the gas may, for example, about 1-20 standard litre per minute (slm), about 1-10 slm, or about 10-20 slm.

Figure 11:
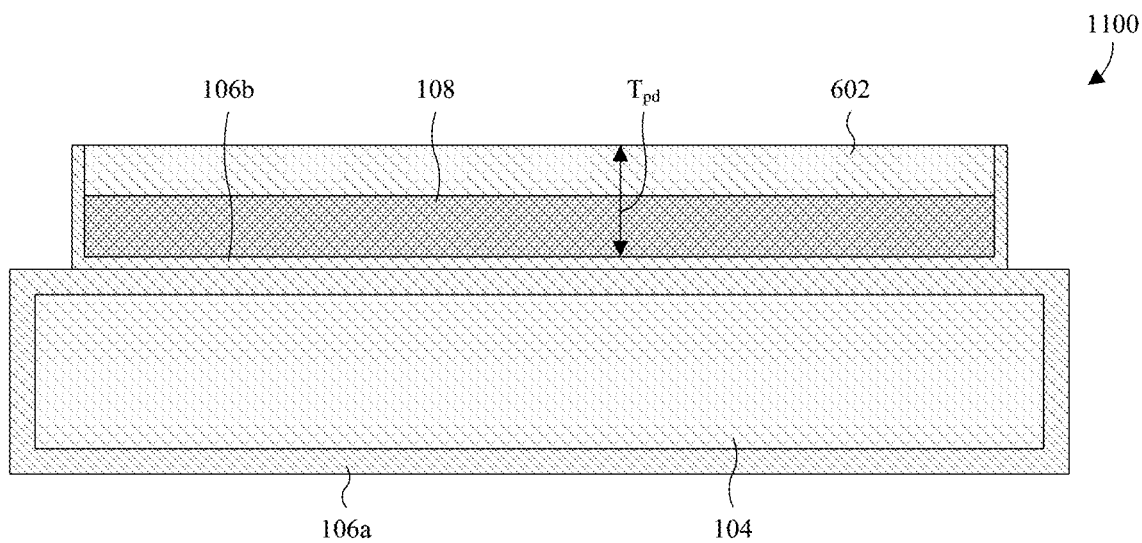

As illustrated by the cross-sectional view 1100 of FIG. 11, a first thinning process is performed into the second insulator layer 106b and the sacrificial substrate 602. The first thinning process removes an upper portion of the second insulator layer 106b, and further removes an upper portion of the sacrificial substrate 602. In some embodiments, the first thinning process is performed into the second insulator layer 106b and the sacrificial substrate 602 until the device layer 108 and the sacrificial substrate 602 collectively have a predetermined thickness $T_{pd}$. The predetermined thickness $T_{pd}$ may, for example, about 20-45 micrometers, about 20-32.5 micrometers, or about 32.5-45 micrometers.

In some embodiments, the first thinning process is partially or wholly performed by a mechanical grinding process. In some embodiments, the first thinning process is performed partially or wholly performed by a chemical mechanical polish (CMP). In some embodiments, the first thinning process is performed by a mechanical grinding process followed by a CMP. As noted above, removal of the edge region 604 of FIG. 6 prevents edge defects from forming at the edge region 604 during the grinding. The edge defects have a propensity to form and concentrate at the edge region 604 during the grinding and negatively impact the quality of the device layer 108.

Figure 12:
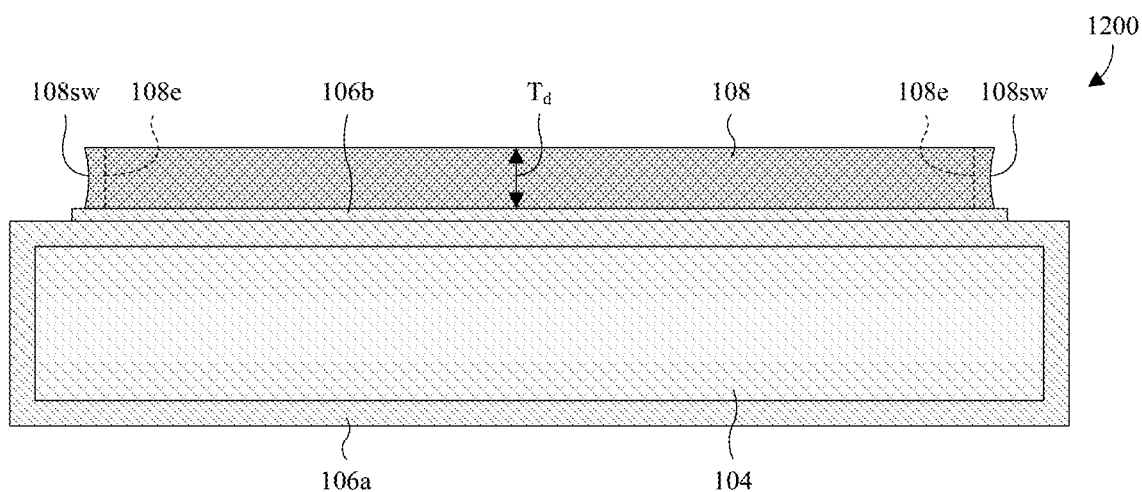

As illustrated by the cross-sectional view 1200 of FIG. 12, an etch is performed into the sacrificial substrate 602 (see FIG. 11). The etch stops on the device layer 108 and remove the sacrificial substrate 602. In some embodiments, the etch further removes a portion of the second insulator layer 106b on sidewalls of the sacrificial substrate 602 and sidewalls of the device layer 108. Further, in some embodiments, the etch laterally etches sidewalls 108sw of the device layer 108. Due to the lateral etching, the sidewalls 108sw of the device layer 108 may, for example, be curved and/or concave. Upon completion of the etch, the thickness $T_d$ of the device layer 108 may, for example, be about 0.6-9.5 micrometers, about 0.6-5.05 micrometers, or about 5.05-9.5 micrometers. In some embodiments, the etch minimally reduces the thickness $T_d$ of the device layer 108 due to, for example, over etching.

In some embodiments, the etch is performed by a hydrofluoric/nitric/acetic (HNA) etch, some other wet etch, a dry etch, or some other etch. The HNA etch may, for example, etch the sacrificial substrate 602 with a chemical solution comprising hydrofluoric acid, nitric acid, and acetic acid. The etch has a first etch rate for material of the sacrificial substrate 602, and further has a second etch rate for material of the device layer 108 that is less than the first etch rate. In some embodiments, the first etch rate is about 90-100, 90-95, or 95-100 times greater than the second etch rate. These embodiments of the first and second etch rates may, for example, arise when the first etch is performed by the HNA etch, the sacrificial substrate 602 is or comprises P+ monocrystalline silicon, and the device layer 108 is or comprises P− monocrystalline silicon.

Due to the use of the etch (e.g., the HNA etch) to remove the sacrificial substrate 602, the removal of the sacrificial substrate 602 may, for example, be highly controlled. Therefore, the thickness $T_d$ of the device layer 108 may, for example, be highly uniform across the device layer and a TTV of the device layer 108 may, for example, be low. The TTV may, for example, be low in that it is less than about 500 or 1500 angstroms. In some embodiments, the TTV decreases with the thickness $T_d$ of the device layer 108. For example, the TTV may be less than about 500 angstroms where the thickness $T_d$ of the device layer 108 is less than about 3000 angstroms, and the TTV may be greater than about 500 angstroms, but less than about 1500 angstroms, where the thickness $T_d$ of the device layer 108 is more than about 3000 angstroms.

Figure 13:
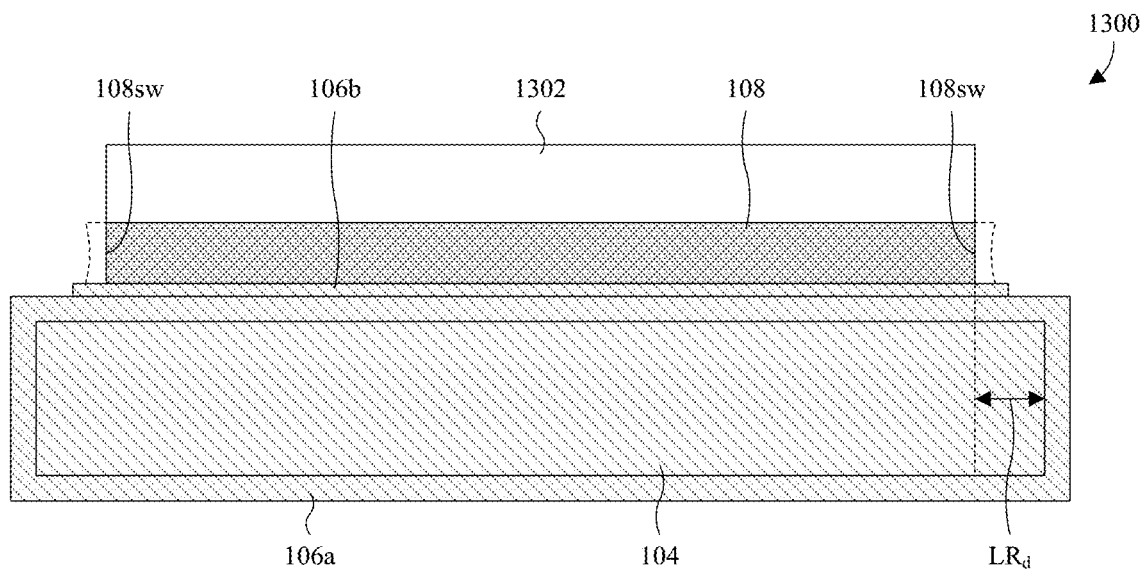

As illustrated by the cross-sectional view 1300 of FIG. 13, the device layer 108 is patterned. The patterning removes edge portions 108e (see FIG. 12) of the device layer 108. By removing the edge portions 108e, edge defects that form at the edge portions 108e during the etch of FIG. 12 are removed. The edge defects reduce the quality of the device layer 108 and form due to lateral etching into the sidewalls 108sw of the device layer 108 during the etch of FIG. 12. The patterning further laterally recesses the sidewalls 108sw of the device layer 108. In some embodiments, after removing the edge portions 108e, the sidewalls 108sw of the device layer 108 are laterally recessed respectively from sidewalls of the handle substrate 104 by a device lateral recess amount $LR_d$. The device lateral recess amount $LR_d$ may, for example, be about 1.4-2.5 millimeters, about 1.4-1.95 millimeters, or about 1.95-2.5 millimeters.

In some embodiments, the patterning is performed by a photolithography/etching process or some other patterning process. Further, in some embodiments, the patterning comprises forming a mask 1302 over the device layer 108, performing an etch into the device layer 108 with the mask 1302 in place, and removing the mask 1302. The mask 1302 may, for example, be or comprise silicon nitride, silicon oxide, some other hard mask material, photoresist, some other mask material, or any combination of the foregoing. The mask 1302 may, for example, be formed so the device layer 108 is completely covered, except for at the edge portions 108e, and/or may, for example, be formed using a WEE process tool. In some embodiments, a process for forming the mask 1302 using the WEE process tool comprises: depositing a photoresist layer on the device layer 108; selectively exposing an edge portion of the photoresist layer to radiation using the WEE process tool; and developing the photoresist layer to form the mask 1302. The etch may, for example, be performed by a dry etch or some other etch, and/or may, for example, stop on the first and second insulator layers 106a, 106b. In some embodiments where the handle substrate 104 has a high resistance (e.g., a resistance greater than about 1 k$\Omega$/cm) and the etch is performed using a dry etch, the first and second insulator layers 106a, 106b prevent arcing by completely covering and/or completely enclosing the handle substrate 104. The mask 1302 may, for example, be removed by plasma ashing or some other removal. The plasma ashing may, for example, comprise exposure of the mask 1302 to $O_2$ plasma and may, for example, be performed when mask 1302 is or comprise photoresist.

In some embodiments, a cleaning process is performed after the patterning of FIG. 13 to remove etch residue and/or other undesired byproducts produced during the patterning. In some embodiments, the cleaning process removes oxide that forms on the device layer 108 during the patterning. The cleaning process may, for example, perform the cleaning using HF acid or some other chemical solution. Hydrogen fluoride may, for example, make about up 0.1-2.0%, about 0.1-1.0%, or about 1.0-2.0% of the HF acid by volume. A remainder of the HF acid may, for example, be deionized water or some other water.

Figure 14:
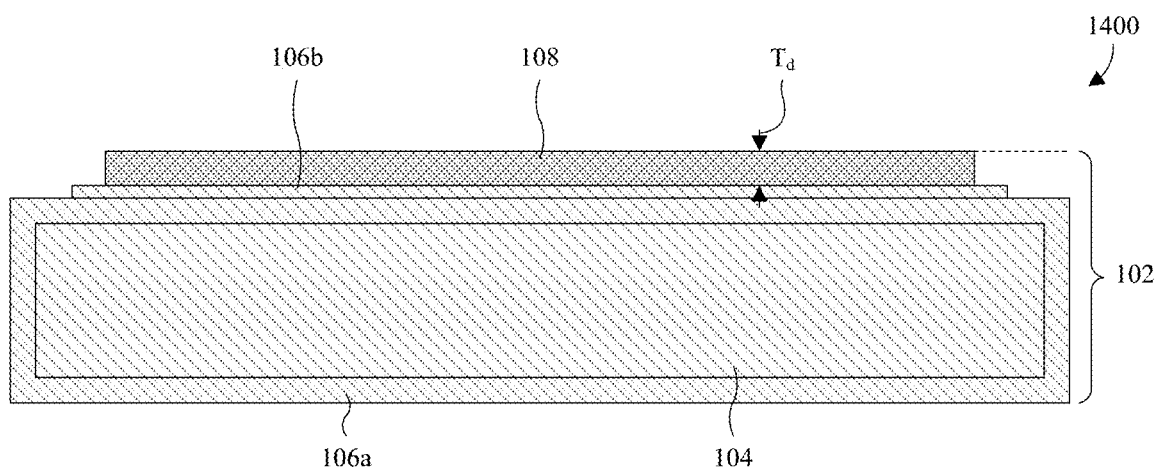

As illustrated by the cross-sectional view 1400 of FIG. 14, a second thinning process is performed into the device layer 108 to reduce the thickness $T_d$ of the device layer 108. In some embodiments, the second thinning process reduces the thickness $T_d$ to about 0.3-8.0 micrometers, about 0.3-4.15 micrometers, or about 4.15-8.0 micrometers, and/or to greater than about 0.3, 1.0, 2.0, 5.0, or 8.0 micrometers. Collectively, the device layer 108, the first insulator layer 106a, the second insulator layer 106b, and the handle substrate 104 define an SOI substrate 102. In some embodiments, the second thinning process is performed by a CMP, some other thinning process, or any combination of the foregoing.

Because the device layer 108 is formed by epitaxy and transferred to the handle substrate 104, the device layer 108 may be formed with a large thickness (e.g., a thickness greater than about 0.3 micrometers). Epitaxy is not subject to the thickness restrictions associated with other approaches for forming the device layer. Further, because the epitaxy is not affected by the thickness of the first and second insulator layers 106a, 106b, the first and second insulator layers 106a may be individually and/or collectively formed with a large thickness (e.g., a thickness greater than about 1 micrometer). The large thickness of the device layer 108 may, for example, enable formation of large semiconductor junctions (e.g., PN junctions) upon which certain devices (e.g., NIR image sensors) may depend. The large thickness of the first and second insulator layers 106a may, for example, facilitate enhanced electrical isolation between devices on the device layer 108 and/or reduce leakage current between the devices. Devices that may benefit from the large thicknesses include, for example, high voltage devices, BCD devices, eFlash devices, CMOS image sensors, NIR image sensors, some other devices, or any combination of the foregoing.

Figure 15:
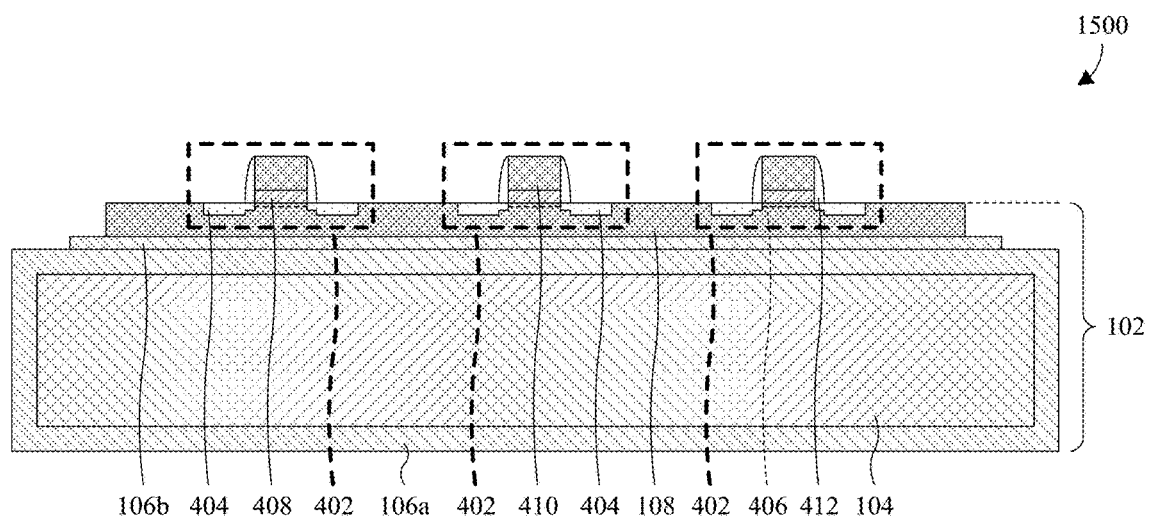

As illustrated by the cross-sectional 1500 of FIG. 15, a plurality of semiconductor devices 402 are formed on the device layer 108. In some embodiments in which the handle substrate 104 has a high resistance (e.g., a resistance greater than about 1 kΩ/cm), the first and second insulator layers 106a, 106b prevent arcing during plasma processing (e.g., plasma etching) performed to form the semiconductor devices 402 by completely covering and/or completely enclosing the handle substrate 104. The semiconductor devices 402 may be, for example, high voltage devices, BCD devices, eFlash devices, CMOS image sensors, NIR image sensors, some other devices, or any combination of the foregoing. The high voltage devices may, for example, be devices that operate at more than about 100 volts.

In some embodiments, the semiconductor devices 402 comprise corresponding source/drain regions 404, corresponding selectively-conductive channels 406, corresponding gate dielectric layers 408, corresponding gate electrodes 410, and corresponding spacers 412. For ease of illustration, only some of the source/drain regions 404 are labeled 404, only one of the selectively-conductive channels 406 is labeled 406, only one of the gate dielectric layers 408 is labeled 408, only one of the gate electrodes 410 is labeled 410, and only one of the spacers 412 is labeled 412. The source/drain regions 404 and the selectively-conductive channels 406 are in the device layer 108. The source/drain regions 404 are respectively at ends of the selectively-conductive channels 406, and each of the selectively-conductive channels 406 extends from one of the source/drain regions 404 to another one of the source/drain regions 404. The gate dielectric layers 408 respectively overlie the selectively-conductive channels 406, and the gate electrodes 410 respectively overlie the gate dielectric layers 408. The spacers 412 overlie the source/drain regions 404 and respectively line sidewalls of the gate electrodes 410.

In some embodiments, a process for forming the semiconductor devices 402 comprises depositing a dielectric layer covering the device layer 108, and further depositing a conductive layer covering the dielectric layer. The conductive layer and the dielectric layer are patterned (e.g., by a photolithography/etching process) into the gate electrodes 410 and the gate dielectric layers 408. Dopants are implanted into the device layer 108 with the gate electrodes 410 in place to define lightly doped portions of the source/drain regions 404, and a spacer layer is formed covering the source/drain regions 404 and the gate electrodes 410. The spacer layer is etched back to form the spacers 412, and dopants are implanted into the device layer 108 with the spacers 412 in place to expand the source/drain regions 404.

Figure 16:
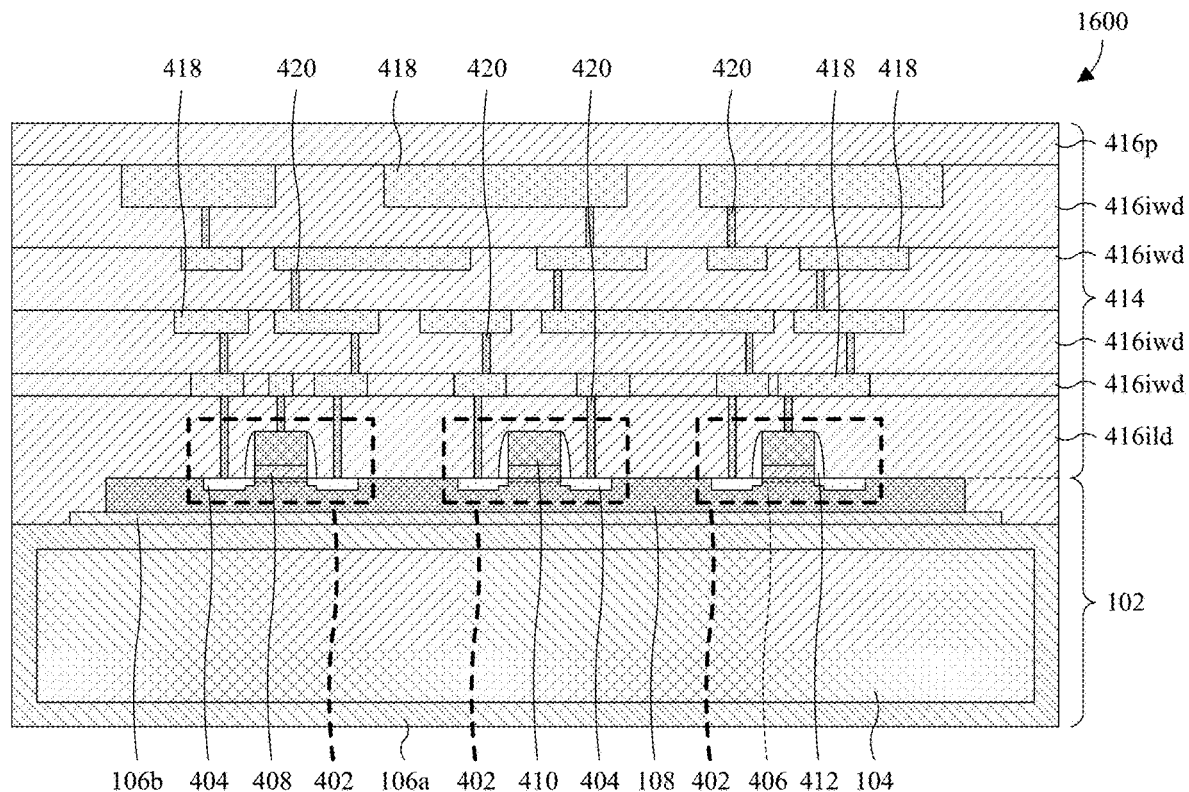

As illustrated by the cross-sectional view 1600 of FIG. 16, a BEOL interconnect structure 414 is formed over the device layer 108 and the semiconductor devices 402. The BEOL interconnect structure 414 comprises an interlayer dielectric (ILD) layer 416ild, a plurality of interwire dielectric (IWD) layers 416iwd, and a passivation layer 416p. The IWD layers 416iwd overlie the ILD layer 416ild, and the passivation layer 416p overlies the IWD layers 416iwd. The ILD layer 416ild, the IWD layers 416iwd, and the passivation layer 416p may be or comprise, for example, BPSG, PSG, USG, some other low κ dielectric, silicon oxide, some other dielectric, or any combination of the foregoing. The BEOL interconnect structure 414 further comprises a plurality of wires 418 and a plurality of vias 420. For ease of illustration, only some of the wires 418 are labeled 418, and only some of the vias 420 are labeled 420. The wires 418 and the vias 420 are alternatingly stacked in an interconnect dielectric layer defined by the ILD layer 416ild, the IWD layers 416iwd, and the passivation layer 416p.

In some embodiments, a process for forming the BEOL interconnect structure 414 comprises forming a bottommost layer of the vias 420 by a single damascene process, and subsequently forming a bottommost layer of the wires 418 by the single damascene process. Further, in some embodiments, the process comprises forming remaining layers of the vias 420 and remaining layers of the wires 418 by repeatedly performing a dual damascene process. In some embodiments, the single damascene process comprises depositing a dielectric layer, patterning the dielectric layer with openings for a single layer of conductive features (e.g., a layer of vias or wires), and filling the openings with conductive material to form the single layer of conductive features. The dielectric layer may, for example, corresponds to the ILD layer 416ild or a bottom IWD layer of the IWD layers 416iwd. In some embodiments, the dual damascene process comprises depositing a dielectric layer, patterning the dielectric layer with openings for two layers of conductive features (e.g., a layer of vias and a layer of wires), and filling the openings with conductive material to form the two layers of conductive features. The dielectric layer may, for example, correspond to one of the IWD layers 416iwd over the bottom IWD layer.

Figure 17:
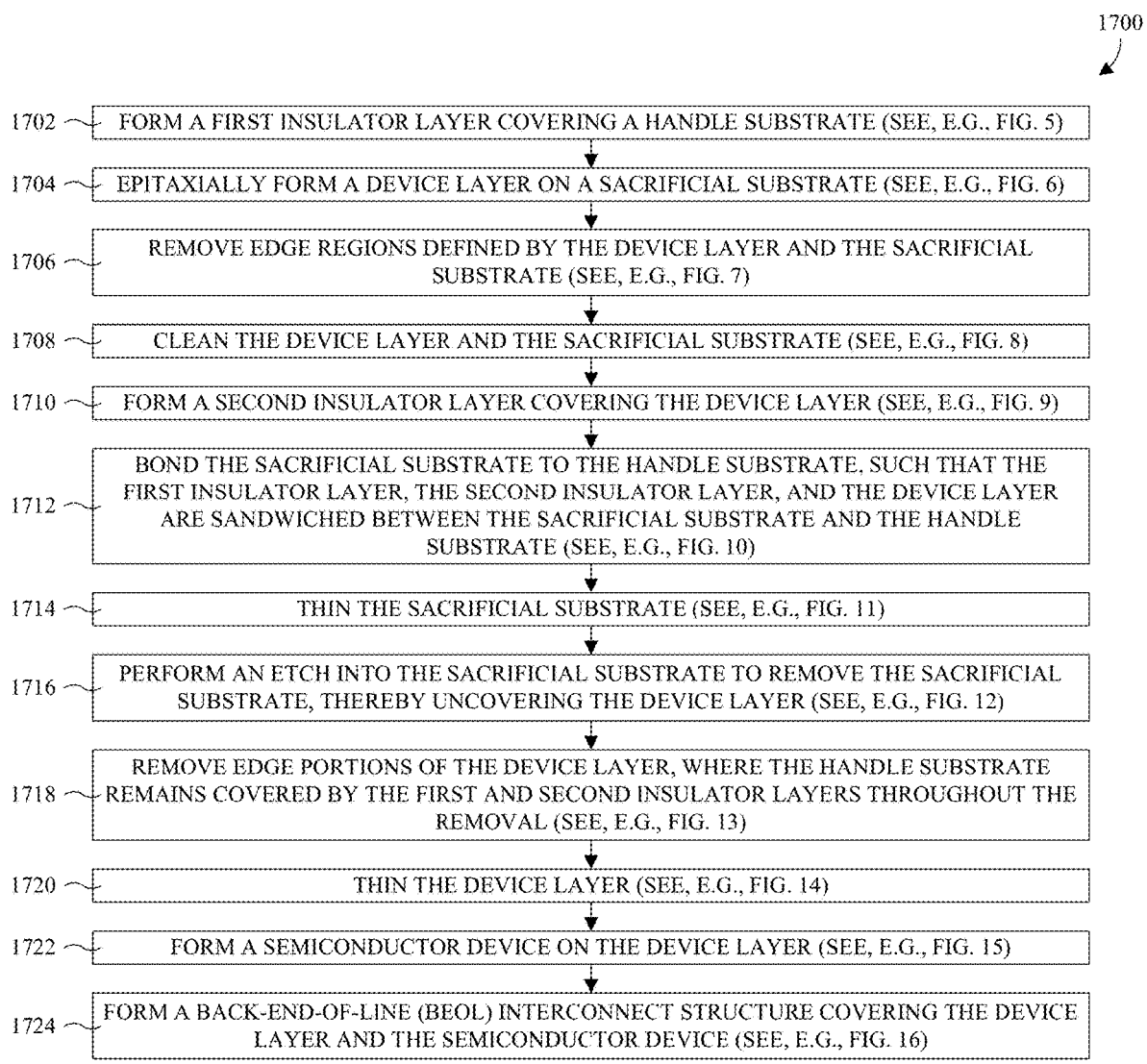
FIG. 17 illustrates a block diagram of some embodiments of the method of FIGS. 5-16.

With reference to FIG. 17, a block diagram 1700 of some embodiments of the method of FIGS. 5-16 is provided. The method may, for example, form a SOI substrate with a thick device layer and a thick insulator layer.

At 1702, a first insulator layer is formed covering (e.g., completely covering) a handle substrate. See, for example, FIG. 5.

At 1704, a device layer is epitaxially formed on a sacrificial substrate. See, for example, FIG. 6.

At 1706, edge regions defined by the device layer and the sacrificial substrate are removed. See, for example, FIG. 7.

At 1708, the device layer and the sacrificial substrate are cleaned. See, for example, FIG. 8.

At 1710, a second insulator layer is formed covering the device layer. See, for example, FIG. 9.

At 1712, the sacrificial substrate is bonded to the handle substrate, such that the first insulator layer, the second insulator layer, and the device layer are sandwiched between the sacrificial substrate and the handle substrate. See, for example, FIG. 10.

At 1714, the sacrificial substrate is thinned. See, for example, FIG. 11.

At 1716, an etch is performed into the sacrificial substrate to remove the sacrificial substrate, thereby uncovering the device layer. See, for example, FIG. 12.

At 1718, edge portions of the device layer are removed, where the handle substrate remains covered (e.g., completely covering) by the first and second insulator layers throughout the removal. See, for example, FIG. 13. Arcing at the handle substrate may, for example, be prevented by the first and second insulator layers in embodiments in which the handle substrate has a high resistance (e.g., a resistance greater than about 1 kΩ/cm), the removal is performed by dry etching, and the handle substrate is completely covered by the first and second insulator layers throughout the removal.

At 1720, the device layer is thinned. See, for example, FIG. 14. The device layer, the first and second insulator layers, and the handle substrate collectively define an SOI substrate. Because the device layer is formed by epitaxy and transferred to the handle substrate, the device layer may be formed with a large thickness (e.g., a thickness greater than about 0.3 micrometers). Epitaxy is not subject to the thickness restrictions associated with other approaches for forming the device layer. Further, because the epitaxy is not affected by the thickness of the insulator layer, the insulator layer may be formed with a large thickness (e.g., a thickness greater than about 1 micrometer).

At 1722, a semiconductor device is formed on the device layer. See, for example, FIG. 15. In some embodiments, the semiconductor devices are formed using plasma processing. For example, plasma etching may be used to pattern a dielectric layer and a conductive layer respectively into a gate dielectric layer and a gate electrode. Arcing at the handle substrate may, for example, be prevented by the first and second insulator layers in embodiments in which the handle substrate has a high resistance (e.g., a resistance greater than about 1 kΩ/cm), the semiconductor devices are formed using plasma processing, and the handle substrate is completely covered by the first and second insulator layers throughout the plasma processing.

At 1724, a BEOL interconnect structure is formed covering the device layer and the semiconductor device. See, for example, FIG. 16.

While the block diagram 1700 of FIG. 17 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides a method for forming a SOI substrate, the method including: forming an insulator layer on a handle substrate; epitaxially forming a device layer on a sacrificial substrate; bonding the sacrificial substrate to the handle substrate, such that the device layer and the insulator layer are between the sacrificial and handle substrates; and removing the sacrificial substrate, wherein the removing includes performing an etch into the sacrificial substrate until the device layer is reached. In some embodiments, the sacrificial substrate and the device layer comprise the same semiconductor material, wherein the sacrificial substrate and the device layer have the same doping types but different doping concentrations. In some embodiments, the sacrificial substrate includes P+ monocrystalline silicon, and wherein the device layer includes P− monocrystalline silicon. In some embodiments, the etch employs a HNA etchant. In some embodiments, the removing further includes grinding the sacrificial substrate before the etch. In some embodiments, the insulator layer is formed completely covering a top surface of the handle substrate, wherein the method further includes: patterning the device layer to remove edge portions of the device layer, wherein the top surface of the insulator layer remains completely covered throughout the patterning. In some embodiments, the patterning includes a dry etch into the device layer, and wherein the dry etch stops on the insulator layer. In some embodiments, the patterning includes forming a mask on the device layer using a WEE process tool. In some embodiments, the handle substrate has a high resistance greater than about 1 kΩ/cm. In some embodiments, the insulator layer completely encloses the handle substrate.

In some embodiments, the present application provides a SOI substrate including: a handle substrate; an insulator layer covering the handle substrate, wherein the insulator layer has a pair of edge portions along an upper surface of the insulator layer, and wherein the edge portions are respectively on opposite sides of the insulator layer and each has a stepped profile; and a device layer overlying the insulator layer. In some embodiments, the insulator layer includes: a pair of first upper surface portions uncovered by the device layer, wherein the first upper surface portions are respectively on the opposite sides of the insulator layer; and a pair of second upper surface portions uncovered by the device layer, wherein the second upper surface portions are respectively on the opposite sides of the insulator layer, wherein the first upper surface portions are laterally between the second upper surface portions and are elevated relative to the second upper surface portions. In some embodiments, the insulator layer completely encloses the handle substrate.

In some embodiments, a thickness of the insulator layer is greater than about 0.7 micrometers, and a thickness of the device layer is greater than about 0.3 micrometers. In some embodiments, the handle substrate includes silicon and has a resistance greater than about 1 kΩ/cm.

In some embodiments, the present application provides a method for forming a SOI substrate, the method including: forming a dielectric layer covering a first semiconductor substrate; epitaxially forming a semiconductor layer on a second semiconductor substrate, wherein the semiconductor layer and the second semiconductor substrate have the same doping types, and wherein the second semiconductor substrate is highly doped relative to the semiconductor layer; bonding the second semiconductor substrate to the first semiconductor substrate, such that the semiconductor layer and the dielectric layer are between the first semiconductor substrate and the second semiconductor substrate; performing a first etch into the second semiconductor substrate until the semiconductor layer is reached; and performing a second etch into the semiconductor layer to remove edge portions of the semiconductor layer, wherein the second etch stops on the dielectric layer. In some embodiments, the dielectric layer completely covers the first semiconductor substrate throughout the second etch, wherein the first semiconductor substrate has a high resistance greater than about 1 kΩ/cm, and wherein the second etch is performed with a dry etchant. In some embodiments, the first etch has a first etch rate for the second semiconductor substrate and a second etch rate for the semiconductor layer, wherein the first etch rate is about 90 or more times greater than the second etch rate. In some embodiments, the semiconductor layer and the second semiconductor substrate are doped with p-type dopants, wherein the first etch employs a HNA etchant. In some embodiments, the method further includes: patterning the semiconductor layer and the second semiconductor substrate to define a ledge, wherein the ledge is recessed below an upper surface of the second semiconductor substrate, and wherein the ledge has a pair of ledge segments respectively on opposite sides of the second semiconductor substrate; and, after defining the ledge, forming a second dielectric layer covering the semiconductor layer, wherein the bonding is performed such that the second dielectric layer is between the first semiconductor substrate and the second semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor-on-insulator (SOI) substrate, the method comprising:
   depositing a first insulator layer on a handle substrate, wherein the first insulator layer completely surrounds the handle substrate;
   forming a device layer on a sacrificial substrate, wherein the sacrificial substrate and the device layer comprise semiconductor material;
   depositing a second insulator layer completely surrounding the device layer and the sacrificial substrate;
   bonding the sacrificial substrate to the handle substrate, such that the device layer and the first insulator layer are between the sacrificial substrate and the handle substrate, wherein the first and second insulator layers directly contact upon completion of the bonding; and
   performing a first etch into the sacrificial substrate until the device layer is reached to remove the sacrificial substrate, wherein the first etch employs a hydrofluoric/nitric/acetic (HNA) etchant;
   wherein the device layer is directly exposed to the HNA etchant.

2. The method according to claim 1, wherein the sacrificial substrate and the device layer have different doping concentrations.

3. The method according to claim 1, wherein the first etch has a first etch rate for the sacrificial substrate and a second etch rate for the device layer, and wherein the first etch rate is 90 or more times greater than the second etch rate.

4. The method according to claim 1, further comprising:
   performing a second etch into the device layer to remove edge portions of the device layer, wherein the first insulator layer completely covers the handle substrate throughout the second etch.

5. The method according to claim 1, further comprising:
   patterning the device layer and the sacrificial substrate to define a ledge, wherein the ledge is recessed below an upper surface of the sacrificial substrate, and wherein the ledge has a pair of ledge segments respectively on opposite sides of the sacrificial substrate;
   wherein the second insulator layer is deposited after defining the ledge, and is further deposited covering the device layer and having a stepped profile conforming to the ledge, wherein the bonding is performed such that the second insulator layer is between the handle substrate and the sacrificial substrate.

6. The method according to claim 1, further comprising:
   performing a grinding process into the sacrificial substrate to partially remove the sacrificial substrate, wherein the grinding process is performed between the first etch and the bonding, and wherein the first etch removes a remainder of the sacrificial substrate.

7. A method for forming a semiconductor-on-insulator (SOI) substrate, the method comprising:
   depositing a first insulator layer on a handle substrate;
   forming a device layer on a sacrificial substrate, wherein the sacrificial substrate and the device layer comprise semiconductor material;
   bonding the sacrificial substrate to the handle substrate, such that the device layer and the first insulator layer are between the sacrificial and handle substrates;
   removing the sacrificial substrate; and
   performing a first etch into the device layer to remove edge portions of the device layer after the removing, wherein the first etch stops on the first insulator layer and the handle substrate is completely covered by the first insulator layer throughout the first etch;
   wherein the first insulator layer completely encloses the handle substrate throughout the removing and the first etch.

8. The method according to claim 7, wherein a sidewall of the device layer has a planar profile before the removing, wherein the sidewall has a concave profile upon completion of the removing, and wherein the sidewall has a planar profile upon completion of the first etch.

9. The method according to claim 7, wherein the first insulator layer directly contacts a first sidewall of the handle substrate and remains on the first sidewall throughout the removing, wherein the method further comprises:

depositing a second insulator layer covering the device layer, wherein the second insulator layer directly contacts a second sidewall of the device layer, and wherein the removing clears the second insulator layer from the second sidewall.

10. The method according to claim 9, wherein the removing comprises:

performing a grinding process, wherein the grinding process partially, but not entirely, removes the sacrificial substrate and the second insulator layer, and wherein the second insulator layer has a first sidewall segment and a second sidewalls segment extending respectively along opposite sidewalls of the device layer, and further has a bottom segment extending along a bottom surface of the device layer from the first sidewall segment to the second sidewall segment, upon completion of the grinding process.

11. The method according to claim 9, wherein the second insulator layer is deposited completely surrounding the device layer and the sacrificial substrate.

12. The method according to claim 7, wherein the sacrificial substrate has a first portion with a first width, and further has a second portion protruding towards the handle substrate from a bottom of the first portion and with a second width less than the first width, during the bonding.

13. The method according to claim 7, further comprising:

forming a semiconductor device on and partially defined by the device layer after the first etch; and forming an interconnect structure covering and electrically coupled to the semiconductor device.

14. A method for forming a semiconductor-on-insulator (SOI) substrate, the method comprising:

forming an insulator layer covering a handle substrate, wherein the insulator layer has a pair of edge portions along a top of the insulator layer; and forming a device layer overlying the insulator layer;

wherein the edge portions are respectively on opposite sides of the insulator layer and each edge portion has a stepped profile stepping downward beginning at a top surface of the insulator layer, which faces and directly contacts a bottom surface of the device layer, wherein a first edge portion of the pair of edge portions has a sidewall extending from the top surface of the insulator layer and facing a same direction as a sidewall of the device layer on a common side of the device layer as the sidewall of the device layer, and wherein the sidewall of the first edge portion and the sidewall of the device layer are laterally offset from each other.

15. The method according to claim 14, wherein the insulator layer comprises:

a pair of first upper surface portions uncovered by the device layer, wherein the first upper surface portions are respectively on the opposite sides of the insulator layer; and a pair of second upper surface portions uncovered by the device layer, wherein the second upper surface portions are respectively on the opposite sides of the insulator layer, and wherein the first upper surface portions are laterally between the second upper surface portions and are elevated relative to the second upper surface portions.

16. The method according to claim 15, wherein the first upper surface portions are part of a first ring-shaped portion of the insulator layer, and wherein the second upper surface portions are part of a second ring-shaped portion of the insulator layer that is recessed relative to the first ring-shaped portion.

17. The method according to claim 14, wherein the insulator layer completely encloses the handle substrate.

18. The method according to claim 14, further comprising:

providing the device layer atop a sacrificial substrate;

bonding the sacrificial substrate to the handle substrate, such that the device layer is between the sacrificial and handle substrates; and removing the sacrificial substrate after the bonding, wherein the removing includes etching the sacrificial substrate using an HNA etchant, and wherein the device layer is exposed to the HNA etchant during the etching.

19. The method according to claim 14, further comprising:

providing a sacrificial substrate atop the device layer;

removing the sacrificial substrate; and performing a first etch into the device layer after the removing, wherein the first etch removes edge portions of the device layer, wherein a sidewall of the device layer has a planar profile before the removing, wherein the sidewall of the device layer has a concave profile upon completion of the removing, and wherein the sidewall of the device layer has a planar profile upon completion of the first etch.

20. The method according to claim 14, wherein a portion of the insulator layer at the device layer is formed by a different deposition than a portion of the insulator layer at the handle substrate.

* * * * *